US009112538B2

(12) United States Patent
Huang et al.

(10) Patent No.: US 9,112,538 B2
(45) Date of Patent: Aug. 18, 2015

(54) SYSTEMS AND METHODS FOR LOOP FEEDBACK

(71) Applicant: LSI Corporation, San Jose, CA (US)

(72) Inventors: Jianzhong Huang, Storrs, CT (US); Yu Kou, San Jose, CA (US); Haitao Xia, San Jose, CA (US); Seongwook Jeong, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1 day.

(21) Appl. No.: 13/800,370

(22) Filed: Mar. 13, 2013

(65) Prior Publication Data
US 2014/0268400 A1    Sep. 18, 2014

(51) Int. Cl.
*G11B 5/035* (2006.01)
*H03M 13/41* (2006.01)
*H03M 13/13* (2006.01)
*G11B 20/10* (2006.01)
*H03M 13/00* (2006.01)
*G11B 5/00* (2006.01)

(52) U.S. Cl.
CPC .............. *H03M 13/41* (2013.01); *G11B 5/035* (2013.01); *G11B 20/10009* (2013.01); *G11B 20/10046* (2013.01); *G11B 20/10268* (2013.01); *H03M 13/13* (2013.01); *H03M 13/6343* (2013.01); *G11B 2005/0013* (2013.01)

(58) Field of Classification Search
CPC .............. H03M 13/03; H03M 13/41; G11B 20/10046; G11B 20/10268; G11B 20/10009; G11B 2005/0013; G11B 5/035; G11B 2020/1275

USPC .......................................... 360/39, 51, 55, 65
See application file for complete search history.

(56) References Cited

U.S. PATENT DOCUMENTS

| 5,357,520 | A | | 10/1994 | Arnett |
|---|---|---|---|---|
| 5,493,454 | A | | 2/1996 | Ziperovich |
| 5,517,146 | A | | 5/1996 | Yamasaki |
| 5,583,705 | A | | 12/1996 | Ziperovich |
| 5,781,358 | A | | 7/1998 | Hasegawa |
| 5,872,664 | A | | 2/1999 | Meier |
| 5,986,830 | A | | 11/1999 | Hein |
| 5,999,355 | A | | 12/1999 | Behrens |
| 6,028,728 | A | * | 2/2000 | Reed ............................. 360/51 |
| 6,032,284 | A | * | 2/2000 | Bliss ........................... 714/792 |
| 6,043,942 | A | | 3/2000 | Cunningham |
| 6,091,560 | A | | 7/2000 | Du |
| 6,130,794 | A | | 10/2000 | Christensen |
| 6,134,691 | A | | 10/2000 | Hirasaka |
| 6,141,168 | A | | 10/2000 | Takahashi |

(Continued)

FOREIGN PATENT DOCUMENTS

| DE | 10127447 | 10/2002 |
|---|---|---|
| GB | 2 320 866 | 6/1997 |

OTHER PUBLICATIONS

Barry J. et al "Iterative Timing Recovery" IEEE Signal Processing Magazine vol. 21, No. 1, Jan. 1, 2004.

(Continued)

*Primary Examiner* — Thomas Alunkal
(74) *Attorney, Agent, or Firm* — Hamilton DeSanctis & Cha

(57) ABSTRACT

The present inventions are related to systems and methods for data processing, and more particularly to systems and methods for performing loop feedback in a data processing system.

22 Claims, 8 Drawing Sheets

(56) References Cited

U.S. PATENT DOCUMENTS

| | | | |
|---|---|---|---|
| 6,147,828 A | 11/2000 | Bloodworth | |
| 6,181,505 B1 | 1/2001 | Sacks | |
| 6,208,477 B1 | 3/2001 | Cloke | |
| 6,208,481 B1 | 3/2001 | Spurbeck | |
| 6,212,024 B1 | 4/2001 | Igarashi | |
| 6,243,031 B1 | 6/2001 | Jusuf | |
| 6,246,723 B1 | 6/2001 | Bliss et al. | |
| 6,332,205 B1 * | 12/2001 | Conway | 714/746 |
| 6,337,778 B1 | 1/2002 | Gagne | |
| 6,396,651 B1 | 5/2002 | Grover | |
| 6,404,572 B1 | 6/2002 | Hong | |
| 6,535,345 B1 | 3/2003 | Shimoda | |
| 6,563,655 B1 | 5/2003 | Yamasaki | |
| 6,621,648 B2 | 9/2003 | Elliott | |
| 6,662,303 B1 | 12/2003 | Toosky | |
| 6,671,244 B2 | 12/2003 | Honma | |
| 6,674,590 B2 | 1/2004 | Ottesen | |
| 6,678,230 B2 | 1/2004 | Miyashita | |
| 6,721,114 B1 | 4/2004 | Sutardja | |
| 6,788,481 B2 | 9/2004 | Fang | |
| 6,819,514 B1 * | 11/2004 | Behrens et al. | 360/65 |
| 6,831,797 B2 | 12/2004 | Koller | |
| 6,894,854 B1 | 5/2005 | Carlson | |
| 6,912,682 B1 | 6/2005 | Aoki | |
| 6,934,100 B2 | 8/2005 | Ueno | |
| 6,937,415 B2 | 8/2005 | Galbraith | |
| 7,012,772 B1 | 3/2006 | Vis | |
| 7,054,088 B2 * | 5/2006 | Yamazaki et al. | 360/65 |
| 7,079,342 B1 | 7/2006 | Han | |
| 7,092,179 B2 | 8/2006 | Yamanouchi | |
| 7,092,180 B2 | 8/2006 | Franck | |
| 7,123,429 B2 | 10/2006 | Musungu | |
| 7,126,773 B1 | 10/2006 | Taratorin | |
| 7,139,143 B2 | 11/2006 | Tsunoda | |
| 7,158,324 B2 | 1/2007 | Stein | |
| 7,170,704 B2 | 1/2007 | DeGroat | |
| 7,193,802 B2 | 3/2007 | Cideciyan | |
| 7,248,424 B2 | 7/2007 | Ueno | |
| 7,256,954 B2 | 8/2007 | Serizawa | |
| 7,262,928 B1 | 8/2007 | Oberg | |
| 7,271,753 B1 | 9/2007 | Padukone | |
| 7,277,376 B2 | 10/2007 | Horie | |
| 7,305,027 B2 | 12/2007 | Chang | |
| 7,308,057 B1 | 12/2007 | Patapoutian | |
| 7,426,236 B1 | 9/2008 | He | |
| 7,440,224 B2 | 10/2008 | Ehrlich | |
| 7,460,323 B2 | 12/2008 | Lee | |
| 7,480,110 B2 | 1/2009 | Brittenham | |
| 7,495,854 B2 | 2/2009 | Hutchins | |
| 7,529,320 B2 | 5/2009 | Byrne et al. | |
| 7,542,227 B2 | 6/2009 | Che | |
| 7,589,924 B2 | 9/2009 | Yoshizawa | |
| 7,606,300 B2 | 10/2009 | Lim | |
| 7,643,238 B2 | 1/2010 | DeGroa | |
| 7,696,838 B2 | 4/2010 | Wada | |
| 7,715,135 B1 | 5/2010 | Sutardja | |
| 7,733,591 B2 | 6/2010 | Bottemiller | |
| 7,859,780 B2 | 12/2010 | Mathew | |
| 7,872,821 B2 | 1/2011 | Grundvig | |
| 7,872,823 B2 | 1/2011 | Liu | |
| 7,924,518 B2 | 4/2011 | Mathew | |
| 7,924,523 B2 | 4/2011 | Mathew | |
| 7,929,240 B2 | 4/2011 | Mathew | |
| 7,929,597 B2 | 4/2011 | Mergen | |
| 7,936,655 B2 | 5/2011 | Hong | |
| 7,948,699 B2 | 5/2011 | Liu | |
| 7,948,702 B2 | 5/2011 | Mueller | |
| 7,957,251 B2 | 6/2011 | Ratnakar Aravind | |
| 7,965,467 B2 | 6/2011 | Mueller | |
| 7,969,337 B2 | 6/2011 | Ratnakar Aravind | |
| 7,974,030 B2 | 7/2011 | Mathew | |
| 8,139,305 B2 | 3/2012 | Mathew | |
| 8,154,815 B2 | 4/2012 | Mueller | |
| 8,175,201 B2 | 5/2012 | Mathew | |
| 8,379,498 B2 * | 2/2013 | Mathew et al. | 369/47.28 |
| 2001/0043416 A1 * | 11/2001 | Kato et al. | 360/40 |
| 2005/0169415 A1 | 8/2005 | Nayak | |
| 2005/0213241 A1 * | 9/2005 | Cideciyan et al. | 360/65 |
| 2006/0221478 A1 * | 10/2006 | Galbraith et al. | 360/39 |
| 2007/0140088 A1 | 6/2007 | Hino | |
| 2007/0236270 A1 | 10/2007 | Chiang | |
| 2007/0260623 A1 | 11/2007 | Jaquette | |
| 2008/0032652 A1 * | 2/2008 | Zhao et al. | 455/226.4 |
| 2008/0049825 A1 | 2/2008 | Chen | |
| 2010/0067621 A1 | 3/2010 | Noelder et al. | |
| 2010/0067628 A1 | 3/2010 | Buehner et al. | |
| 2010/0088357 A1 | 4/2010 | Mathew | |
| 2011/0093517 A1 | 4/2011 | Liu | |
| 2011/0164669 A1 | 7/2011 | Mathew | |
| 2012/0019946 A1 | 1/2012 | Aravind | |
| 2012/0089657 A1 | 4/2012 | Yang | |
| 2012/0212849 A1 * | 8/2012 | Xu et al. | 360/32 |
| 2013/0208376 A1 * | 8/2013 | Yang et al. | 360/53 |

OTHER PUBLICATIONS

Cho and Lee, "An Estimation Technique for Nonlinear Distortion in High Density Magnetic Recording Channels", IEEE Transactions on Magnetics, vol. 34, No. 1, pp. 40-44 Jan. 1998.

DeGroat et al., "Experimental Characterization of Media Noise Based on Equalized Synchronized Drive Data", IEEE Trans. Magnetics, vol. 37, No. 2, pp. 633-638, Mar. 2001.

Farhang-Boroujeny, Adaptive Filters: Theory and Applications. John Wiley & Sons Ltd, 1998, Chapter 11. pp. 373-379.

Kavcic and Patapoutian, "A Signal-Dependent Autoregressive Channel Model", IEEE Trans. Magnetics, vol. 35 No. 5, pp. 2316-2318, Sep. 1999.

Lin et al. "An estimation technique for accurately modelling the magnetic recording channel including nonlinearities." IEEE Trans. Mag. vol. 25, No. 5, pp. 4084-4086, Sep. 1989.

Moon, J., "Signal-to-Noise Ratio Definition for Magnetic Recording Channels With Transition Noise", IEEE Trans. Magnetics, vol. 36, No. 5, pp. 3881-3883, Sep. 2000.

Palmer et al, "Identification of nonlinear write effects using pseudo-random sequences" IEEE Trans. Magnetics, vol. 23 No. 5, pp. 2377-2379, Sep. 1987.

Partovi; et al., "Flow-Through Latch and Edge-Triggered Flip-Flop Hybrid Elements"; Feb. 8, 1996; pp. 138-139; Solid-State Circuits Conf Digest of Technical Papers IEEE.

Tokumasu et al. "A New Reduced Clock-Swing Flip-Flop (NDKFF)," Corporate Research & Development Center, Toshiba Corporation. IEEE Feb. 2002 Custom Intergrated Circuits Conf.

U.S. Appl. No. 13/180,311, filed Jul. 11, 2011, Weijun Tan, Unpublished.

U.S. Appl. No. 13/100,063, filed May 3, 2011, Ming Jin, Unpublished.

Wood and Donaldson, "The Helical-Scan Magnetic Tape Recorder as a Digital Communication Channel", IEEE Transactions on Magnetics, vol. MAG-15, No. 2, pp. 935-943 Mar. 1979.

* cited by examiner

SYSTEMS AND METHODS FOR LOOP FEEDBACK

FIELD OF THE INVENTION

The present inventions are related to systems and methods for data processing, and more particularly to systems and methods for performing loop feedback in a data processing system.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. In some cases, the corruption cannot be corrected using standard processing.

Hence, for at least the aforementioned reasons, there exists a need in the art for advanced systems and methods for data decoding.

BRIEF SUMMARY

The present inventions are related to systems and methods for data processing, and more particularly to systems and methods for performing loop feedback in a data processing system.

Various embodiments of the present invention provide data processing systems that include a loop feedback circuit. The loop feedback circuit includes: a state detector based equalization circuit operable to equalize a data input to yield a equalizer output, and a data detector circuit operable to apply a data detection algorithm to the equalizer output to yield a detected output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
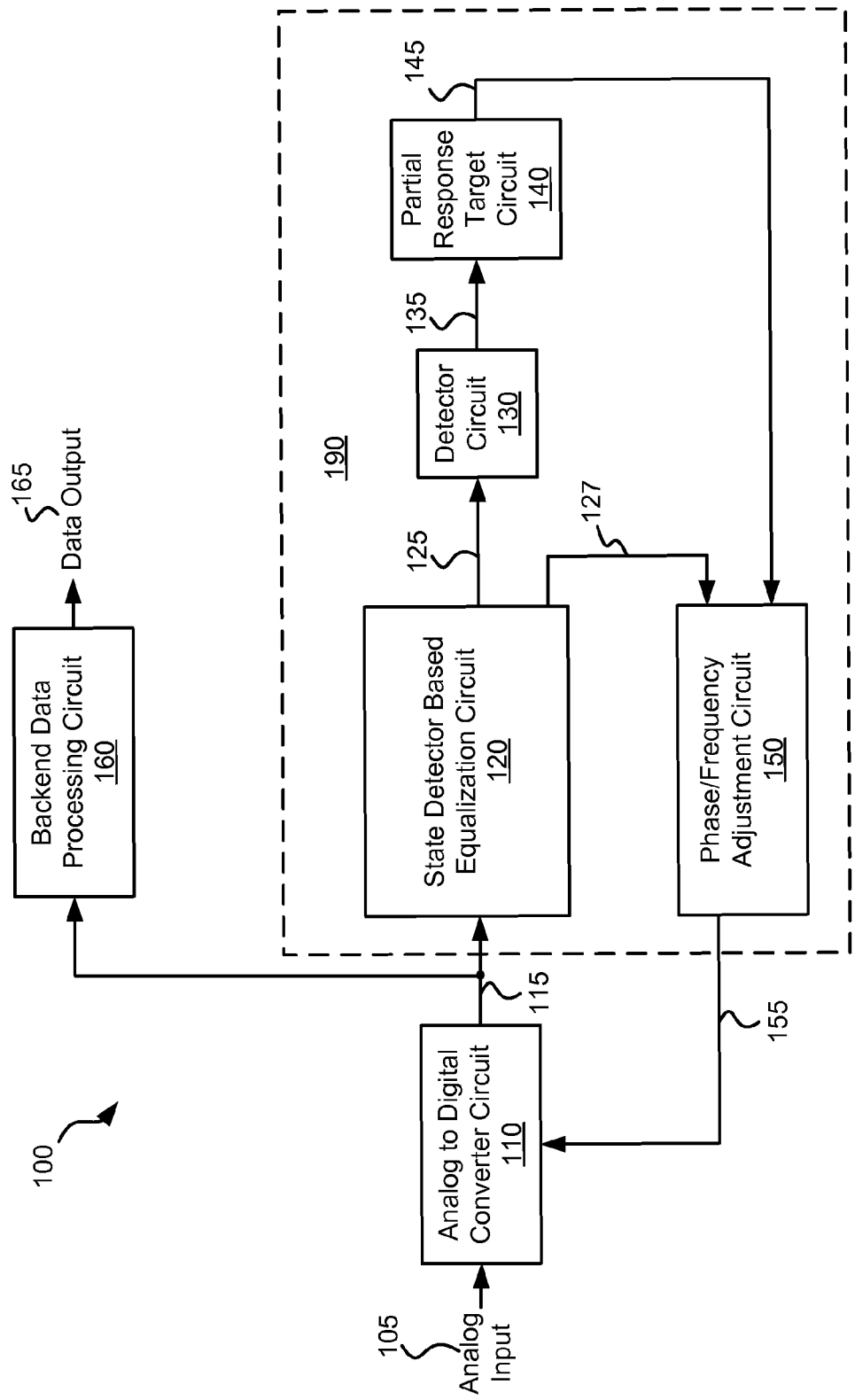
FIG. 1 depicts a data processing circuit including a timing recovery loop circuit relying on a state detector based equalization circuit in accordance with various embodiments of the present invention.

The present inventions are related to systems and methods for data processing, and more particularly to systems and methods for performing loop feedback in a data processing system.

Various embodiments of the present invention provide data processing systems that include a loop feedback circuit. The loop feedback circuit includes: a state detector based equalization circuit operable to equalize a data input to yield a equalizer output, and a data detector circuit operable to apply a data detection algorithm to the equalizer output to yield a detected output. In some instances of the aforementioned embodiments, the data processing system is implemented as an integrated circuit. In one or more instances of the aforementioned embodiments, the data processing system is incorporated in a storage device. In other instances of the aforementioned embodiments, the data processing system is incorporated in a data transmission device.

In some instances of the aforementioned embodiments, the data processing system further includes an analog to digital converter circuit operable to convert an analog input into a series of digital samples provided as the data input synchronized by a sampling clock. In such instances, the loop feedback circuit may include a sample clock adjustment circuit operable to update the sampling clock based upon a combination of the equalizer output and the detected output. In some cases, the data processing system further includes a backend processing circuit operable to recover an original data set using the data input. In some such cases, the data detector circuit is a first data detector circuit, the detected output is a first detected output, and the data detection algorithm is a first data detection algorithm. The backend processing circuit includes: a digital finite impulse response circuit operable to equalize the data input to yield a detector input; a second data detector circuit operable to apply a second data detection algorithm to the detector input to yield a second detected output; and a data decoder circuit operable to apply a data decode algorithm to a decoder input to yield a decoded output. The decoder input is derived from the second detected output.

In various instances of the aforementioned embodiments, the data detection algorithm is a first data detection algorithm. The state detector based equalization circuit includes: a left phase equalizer circuit operable to equalize the data input to yield a left phase equalized output, a center phase equalizer circuit operable to equalize the data input to yield a center phase equalized output, a right phase equalizer circuit operable to equalize the data input to yield a right phase equalized output, a left phase channel detector circuit operable to apply a second data detection algorithm to the left phase equalized output to yield a left phase detected output, a center phase channel detector circuit operable to apply the second data detection algorithm to the center phase equalized output to yield a center phase detected output, a right phase channel detector circuit operable to apply the second data detection algorithm to the right phase equalized output to yield a right phase detected output, and a selection circuit operable to provide one of the left phase detected output, the center phase detected output, or the right phase detected output as the equalizer output. The left phase equalized output is offset from a center phase by a first phase offset, and the right phase equalized output is offset from the center phase by a second phase offset. In some cases, the first detection algorithm includes more states than the second detection algorithm. In one particular cases, the first detection algorithm is a sixteen state data detection algorithm, and the second detection algorithm is a four state data detection algorithm.

In various cases, the state detector based equalization circuit further includes an adaptive Viterbi circuit operable to update edge mean values based at least in part on the center phase detected output and a known input. Application of the second data detection algorithm by the center phase channel detector circuit is controlled at least in part by the edge mean values. In various cases, the edge mean values are only updated when a possible error event is detected. The possible error event is defined as a path beginning at the divergence between a known data path and a decision data path and ending at re-convergence of the known data path and the decision data path. In one or more cases, updating the edge mean values includes calculating a delta K value in accordance with the following equation:

$$\Delta_k = \sum_{i=0}^{L} \left\{ \begin{array}{c} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\},$$

where L is the length of the possible error event, edge mean$_{k+i}^{known\ data\ path\ branch}$ is the expected output along the known data path at time or index k+i, and edge mean$_{k+i}^{decision\ data\ path\ branch}$ is the expected output along the Viterbi decision path at time or index k+i, $y_{k+i}$ is the input signal for corresponding detector or the equalized output from corresponding detector depending upon which is selected, and k+i is an index identifying a particular state transition. In some cases, the edge mean values are only updated when a value of delta K exceeds a threshold value.

In one or more cases, updating the edge mean values is done in accordance with the following equations:

edge mean$_{k+i}^{known\ data\ path\ branch}$=edge mean$_{k+i}^{known\ data\ path\ branch}$+μ($y_{k+i}$−edge mean$_{k+i}^{known\ data\ path\ branch}$), edge mean$_{k+i}^{decision\ data\ path\ branch}$=edge mean$_{k+i}^{decision\ data\ path\ branch}$−μ($y_{k+i}$−edge mean$_{k+i}^{decision\ data\ path\ branch}$), where μ is a gain factor, L is the length of the possible error event, edge mean$_{k+i}^{known\ data\ path\ branch}$ is the expected output along the known data path at time or index k+i, and edge mean$_{k+i}^{decision\ data\ path\ branch}$ is the expected output along the Viterbi decision path at time or index k+i, $y_{k+i}$ is the input signal for corresponding detector or the equalized output from corresponding detector depending upon which is selected, and k+i is an index identifying a particular state transition.

Other embodiments of the present invention provide data processing methods that include: converting an analog input into a series of digital samples provided as a data input; equalizing the data input using a left phase equalizer circuit to yield a left phase equalized output; equalizing the data input using a center phase equalizer circuit to yield a center phase equalized output; applying a second data detection algorithm to the left phase equalized output to yield a left phase detected output; applying the second data detection algorithm to the center phase equalized output to yield a center phase detected output; selecting one of the left phase detected output or the center phase detected output as an equalizer output; applying a first data detection algorithm to the equalizer output to yield a detected output; and updating a feedback output based upon a combination of the equalizer output and the detected output. The left phase equalized output is offset from a center phase by a phase offset, and the center phase equalized output is not offset from the center phase.

Turning to FIG. 1, a data processing circuit 100 includes a timing recovery loop circuit 190 relying on a state detector based equalization circuit 120 in accordance with various embodiments of the present invention. Data processing circuit 100 includes an analog to digital converter circuit 110 that samples an analog input 105 synchronous to a sampling clock 155 to yield a series of digital samples 115. In some cases, analog input 105 is derived from a read/write head assembly (not shown) that is disposed in relation to a storage medium (not shown). In other cases, analog input 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived. Analog to digital converter circuit 110 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention.

Digital samples 115 are provided to a backend data processing circuit 160 that operates to recover an originally written data set which is provided as a data output 165. backend data processing circuit 160 may be any circuit known in the art for recovering an originally written data set from a series of digital samples. In one particular embodiment of the present invention, backend data processing circuit 160 includes an equalizer circuit (not shown) that equalizes digital samples 115 to yield an equalized output, a data detector circuit (not shown) that applies a data detection algorithm to the equalized output to yield a detected output, and a data decoder circuit (not shown) operable to apply a data decode algorithm to the detected output to yield data output 165. The data detector circuit may be, but is not limited to, a maximum a posteriori data detector circuit or a Viterbi algorithm data detector circuit as are known in the art. The data decoder circuit may be, but is not limited to, a low density parity check decoder circuit as are known in the art. The equalizer circuit may be, but is not limited to, a digital finite response filter circuit as are known in the art. Based upon the disclosure provided herein, one of ordinary skill in the art will recognize a variety of implementations of backend data processing circuit 160 that may be used in relation to different embodiments of the present invention.

Additionally, digital samples 115 are provided to timing recovery loop circuit 190 where they are used to update sampling clock 155. Timing recovery loop circuit 190 includes a state detector based equalization circuit 120 that equalizes digital samples 115 to yield an equalized output 125. State detector based equalization circuit 120 may be implemented similar to one of the circuits discussed below in relation to FIGS. 2-5. Timing recovery loop circuit 190 may operate similar to that discussed below in relation to FIG. 9. A version of equalized output 125 is also provided as a y-output 127.

Equalized output 125 is provided to a detector circuit 130 that applies a data detection algorithm to equalized output 125 to yield a detected output 135. Detector circuit 130 may be, but is not limited to, a sixteen state Viterbi algorithm data detector circuit. Based upon the disclosure provided herein, one of ordinary skill in the art will recognize other types of data detectors that may be used in place of detector circuit 130. Detected output 135 is provided to a partial response target circuit 140 that filters detected output using a target to yield an ideal output 145. Based upon the disclosure provided herein, one of ordinary skill in the art will recognize a variety of circuits that may be used to derive an ideal output in accordance with different embodiments of the present invention.

Ideal output 145 and y-output 127 are provided to a phase/frequency adjustment circuit 150. Phase/frequency adjustment circuit 150 is operable to calculate a difference between ideal output 145 and y-output 127. The difference corresponds to an error, and the error is used to adjust sampling clock 155. The feedback loop is adaptively adjusted to reduce the error by modifying the phase and/or frequency of sampling clock 155. Based upon the disclosure provided herein, one of ordinary skill in the art will recognize a variety of circuits that may be used in relation to different embodiments of the present invention to adjust sampling clock 155 based upon a difference between ideal output 145 and y-output 127.

Figure 2:
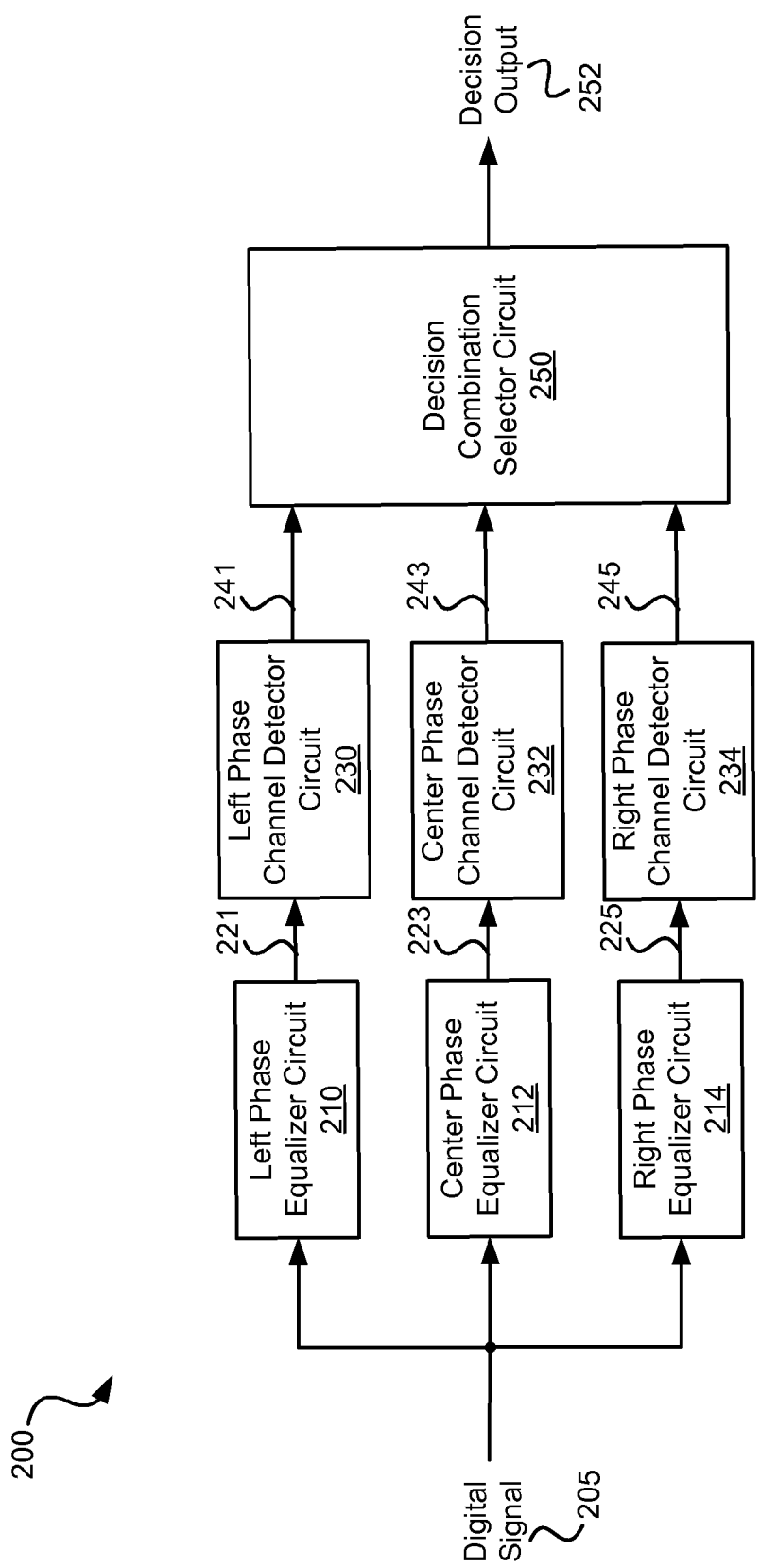
FIG. 2 shows an implementation of a state detector based equalization circuit in accordance with one embodiment of the present invention.

Turning to FIG. 2, a state detector based equalization circuit 200 is shown in accordance with one embodiment of the present invention. State detector based equalization circuit 200 may be used in place of state detector based equalization circuit 120. Where state detector based equalization circuit 200 is used in place of state detector based equalization circuit 120, digital samples 115 are provided as a digital signal 205.

State detector based equalization circuit 200 includes a left phase equalizer circuit 210 that is operable to equalize digital signal 205 adjusted for a left phase to yield a left phase equalized output 221. Left phase equalizer circuit 210 may be implemented as a digital finite impulse response filter circuit. Digital signal 205 adjusted for the left phase is done by interpolating digital signal 205 to correspond to a sampling clock operating at the current sampling phase less an offset (i.e., current sampling phase −Δ phase). In some embodiments of the present invention, the value of Δ phase is programmable, while in other embodiments the value of Δ phase is fixed. In addition, state detector based equalization circuit 200 includes a center phase equalizer circuit 212 that is operable to equalize digital signal 205 to yield a center phase equalized output 223. Center phase equalizer circuit 212 may be implemented as a digital finite impulse response filter circuit. Yet further, state detector based equalization circuit 200 includes a right phase equalizer circuit 214 that is operable to equalize digital signal 205 adjusted for a right phase to yield a right phase equalized output 225. Right phase equalizer circuit 214 may be implemented as a digital finite impulse response filter circuit. Digital signal 205 adjusted for the right phase is done by interpolating digital signal 205 to correspond to a sampling clock operating at the current sampling phase plus an offset (i.e., current sampling phase +Δ phase). Again, in some embodiments of the present invention, the value of Δ phase is programmable, while in other embodiments the value of Δ phase is fixed. Using a left phase, center phase and right phase equalizer circuits allows for an extended range of phase adjustment by timing recovery loop circuit 190.

Left phase equalized output 221 is provided to a left phase channel detector circuit 230. In some embodiments of the present invention, left phase channel detector circuit 230 is a four state Viterbi algorithm data detector circuit. Left phase channel detector circuit 230 is operable to apply a data detection algorithm to left phase equalized output 221 to yield a left phase detected output 241. Left phase detected output 241 includes both hard decisions and soft data. Such soft data is a likelihood that a corresponding hard decision is correct. In some cases, the data is log likelihood ratio (LLR) data as is known in the art. Center phase equalized output 223 is provided to a center phase channel detector circuit 232. In some embodiments of the present invention, center phase channel detector circuit 232 is a four state Viterbi algorithm data detector circuit. Center phase channel detector circuit 232 is operable to apply the data detection algorithm to center phase equalized output 223 to yield a center phase detected output 243. Center phase detected output 243 includes both hard decisions and soft data. Right phase equalized output 225 is provided to a right phase channel detector circuit 234. In some embodiments of the present invention, right phase channel detector circuit 234 is a four state Viterbi algorithm data detector circuit. Right phase channel detector circuit 234 is operable to apply the data detection algorithm to right phase equalized output 225 to yield a right phase detected output 245. Right phase detected output 245 includes both hard decisions and soft data.

Each of left phase detected output 241, center phase detected output 243 and right phase detected output 245 are provided to a decision combination selector circuit 250. Decision combination selector circuit 250 selects one of left phase detected output 241, center phase detected output 243 or right phase detected output 245 that exhibits the highest quality as indicated by the soft data. The selected one of left phase detected output 241, center phase detected output 243 or right phase detected output 245 is provided as decision output 252. As such, decision output 252 includes both the hard decisions and the soft data corresponding to the selected one of left phase detected output 241, center phase detected output 243 or right phase detected output 245.

Figure 3:
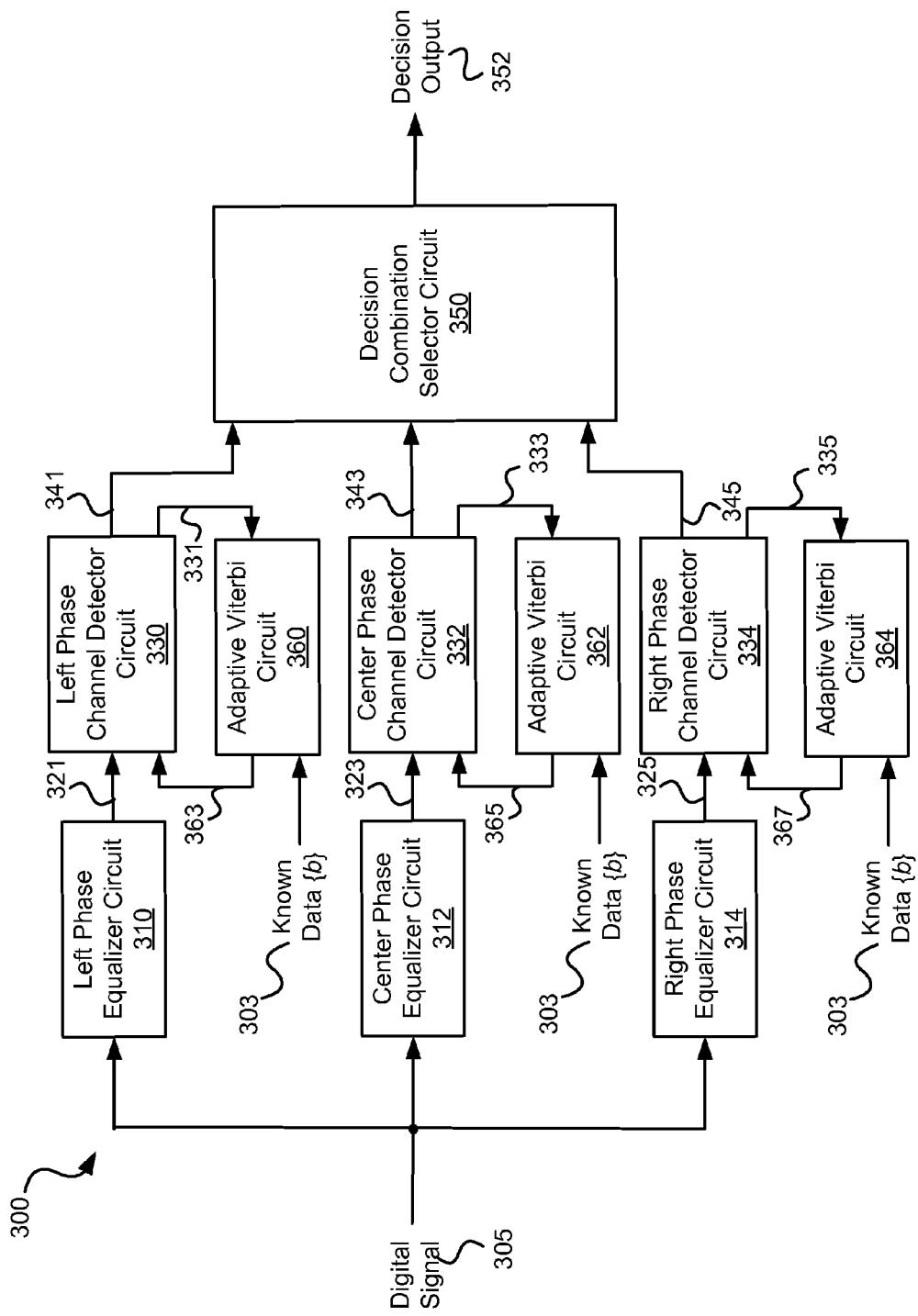
FIG. 3 shows another implementation of a state detector based equalization circuit including parallel adaptive Viterbi circuits in accordance with some embodiments of the present invention.

Turning to FIG. 3, a state detector based equalization circuit 300 including parallel adaptive Viterbi circuits 360, 362, 364 is shown in accordance with some embodiments of the present invention. State detector based equalization circuit 300 may be used in place of state detector based equalization circuit 120. Where state detector based equalization circuit 300 is used in place of state detector based equalization circuit 120, digital samples 115 are provided as a digital signal 305 and a decision output 352 is provided as equalized output 125.

State detector based equalization circuit 300 includes a left phase equalizer circuit 310 that is operable to equalize digital signal 305 adjusted for a left phase to yield a left phase equalized output 321. Left phase equalizer circuit 310 may be implemented as a digital finite impulse response filter circuit. Digital signal 305 adjusted for the left phase is done by interpolating digital signal 305 to correspond to a sampling clock operating at the current sampling phase less an offset (i.e., current sampling phase −Δ phase). In some embodiments of the present invention, the value of Δ phase is programmable, while in other embodiments the value of Δ phase is fixed. In addition, state detector based equalization circuit 300 includes a center phase equalizer circuit 312 that is operable to equalize digital signal 305 to yield a center phase equalized output 323. Center phase equalizer circuit 312 may be implemented as a digital finite impulse response filter circuit. Yet further, state detector based equalization circuit 300 includes a right phase equalizer circuit 314 that is operable to equalize digital signal 305 adjusted for a right phase to yield a right phase equalized output 325. Right phase equalizer circuit 314 may be implemented as a digital finite impulse response filter circuit. Digital signal 305 adjusted for the right phase is done by interpolating digital signal 305 to correspond to a sampling clock operating at the current sampling phase plus an offset (i.e., current sampling phase +Δ phase). Again, in some embodiments of the present invention, the value of Δ phase is programmable, while in other embodiments the value of Δ phase is fixed. Using a left phase, center phase and right phase equalizer circuits allows for an extended range of phase adjustment by timing recovery loop circuit 190.

Left phase equalized output 321 is provided to a left phase channel detector circuit 330. In some embodiments of the present invention, left phase channel detector circuit 330 is a four state Viterbi algorithm data detector circuit. Left phase channel detector circuit 330 is operable to apply a data detection algorithm to left phase equalized output 321 to yield a left phase detected output 341. Left phase detected output 341 includes both hard decisions and soft data.

Figure 6:
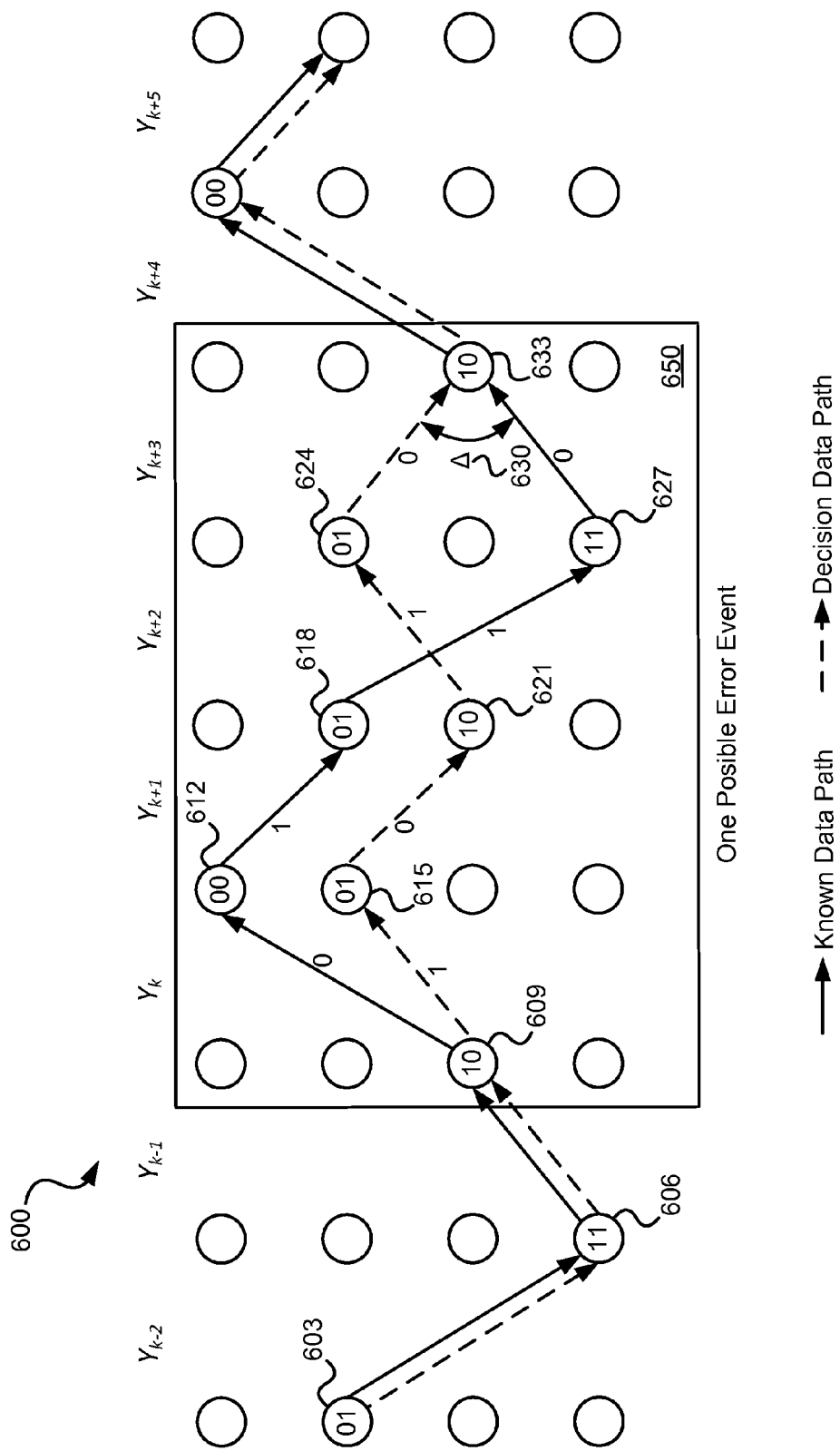
FIG. 6 is a trellis diagram showing an example operation of a state detector based equalization circuit.

Left phase channel detector circuit 330 applies the data detection algorithm guided by edge mean values 363 calculated by an adaptive Viterbi circuit 360. In particular, adaptive Viterbi circuit 360 calculates edge mean values 363 based upon a known data input 303 and an input 331 corresponding to left phase detected output 341. In particular, adaptive Viterbi circuit 360 determines whether a possible error event has occurred. A possible error event is defined as a finite path beginning at the divergence between a known data path and a decision data path and ending at re-convergence of the known data path and the decision data path. Turning to FIG. 6, a trellis diagram 600 is depicted that shows an example of such a possible error event. In particular, the decision data path (i.e., the output from left phase channel detector circuit 330) transitions to state 615 and the known data path (i.e., an output from a channel detector circuit where known data 303 is provided as an input) transitions to state 612. This divergence of the known data path and the decision data path continue until each path re-converges at state 633. Based upon the disclosure provided herein, one of ordinary skill in the art will recognize a variety of possible error events that may occur in relation to one or more embodiments of the present invention. The identification of a possible error event is done by an adaptive Viterbi circuit.

Where a possible error event is not identified by adaptive Viterbi circuit 360, edge mean values 363 are not updated. Alternatively, where a possible error event is identified by adaptive Viterbi circuit 360, a delta K value is calculated for the possible event. The delta K value is calculated in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\},$$

where L is the length of the possible error event. Thus, using the example of FIG. 6, L is equal to three (3) corresponding to the number of transitions between state 609 and state 633 less one (1). The term edge $\text{mean}_{k+i}^{known\ data\ path\ branch}$ is the expected output along the known data path at time or index k+i. Thus, using the example of FIG. 6, edge $\text{mean}_{k+0}^{known\ data\ path\ branch}$ is the expected output along the known data for a transition between state 609 and state 612, edge $\text{mean}_{k+1}^{known\ data\ path\ branch}$ is the expected output along the known data for a transition between state 612 and state 618, edge $\text{mean}_{k+2}^{known\ data\ path\ branch}$ is the expected output along the known data for a transition between state 618 and state 627, and edge $\text{mean}_{k+3}^{known\ data\ path\ branch}$ is the expected output along the known data for a transition between state 627 and state 633. The term edge $\text{mean}_{k+i}^{decision\ data\ path\ branch}$ is the expected output along the Viterbi decision path at time or index k+i. Thus, using the example of FIG. 6, edge $\text{mean}_{k+0}^{decision\ data\ path\ branch}$ is the expected output along the Viterbi decision path for a transition between state 609 and state 615, edge $\text{mean}_{k+1}^{decision\ data\ path\ branch}$ is the expected output along the Viterbi decision path for a transition between state 615 and state 621, edge $\text{mean}_{k+2}^{decision\ data\ path\ branch}$ is the expected output along the Viterbi decision path for a transition between state 621 and state 624, and edge $\text{mean}_{k+3}^{decision\ data\ path\ branch}$ is the expected output along the Viterbi decision path for a transition between state 624 and state 633. The term $y_{k+i}$ is input 331 corresponding to the k+i state transition.

Adaptive Viterbi circuit 360 compares the calculated delta K value with a threshold value. This threshold value may be either fixed or programmable depending upon the particular implementation. Where the delta K value is greater than the threshold value, edge mean values 363 are not updated. In contrast, where the delta K value is equal to or smaller than the threshold value, adaptive Viterbi circuit 360 calculates updated edge mean values 363. Updated edge mean values 363 are calculated in accordance with the following equations:

edge $\text{mean}_{k+i}^{known\ data\ path\ branch}$=edge $\text{mean}_{k+i}^{known\ data\ path\ branch}$+μ($y_{k+i}$−edge $\text{mean}_{k+i}^{known\ data\ path\ branch}$), edge $\text{mean}_{k+i}^{decision\ data\ path\ branch}$=edge $\text{mean}_{k+i}^{decision\ data\ path\ branch}$−μ($y_{k+i}$−edge $\text{mean}_{k+i}^{decision\ data\ path\ branch}$), where μ is a gain factor. In some cases, μ is less than one (1). In particular cases, μ is less than 0.1. In various embodiments of the present invention μ is programmable, while in other embodiments μ is fixed.

Center phase equalized output 323 is provided to a center phase channel detector circuit 332. In some embodiments of the present invention, center phase channel detector circuit 332 is a four state Viterbi algorithm data detector circuit. Center phase channel detector circuit 332 is operable to apply the data detection algorithm to center phase equalized output 323 to yield a center phase detected output 343. Center phase detected output 343 includes both hard decisions and soft data.

Center phase channel detector circuit 332 applies the data detection algorithm guided by edge mean values 365 calculated by an adaptive Viterbi circuit 362. In particular, adaptive Viterbi circuit 362 calculates edge mean values 365 based upon a known data input 303 and an input 333 corresponding to center phase detected output 333. In particular, adaptive Viterbi circuit 362 determines whether a possible error event has occurred. Again, a possible error event is defined as a finite path beginning at the divergence between a known data path and a decision data path and ending at re-convergence of the known data path and the decision data path.

Where a possible error event is not identified by adaptive Viterbi circuit 362, edge mean values 365 are not updated. Alternatively, where a possible error event is identified by adaptive Viterbi circuit 362, a delta K value is calculated for the possible event. The delta K value is calculated in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\}.$$

The term $y_{k+i}$ is input 333 corresponding to the k+i state transition.

Adaptive Viterbi circuit 362 compares the calculated delta K value with the same threshold value used by adaptive Viterbi circuit 362. Where the delta K value is greater than the threshold value, edge mean values 365 are not updated. In contrast, where the delta K value is equal to or smaller than the threshold value, adaptive Viterbi circuit 362 calculates updated edge mean values 365. Updated edge mean values 365 are calculated in accordance with the following equations:

edge mean$_{k+i}^{known\ data\ path\ branch}$=edge mean$_{k+i}^{known\ data\ path\ branch}$+μ($y_{k+i}$−edge mean$_{k+i}^{known\ data\ path\ branch}$), edge mean$_{k+i}^{decision\ data\ path\ branch}$=edge mean$_{k+i}^{decision\ data\ path\ branch}$−μ($y_{k+i}$−edge mean$_{k+i}^{decision\ data\ path\ branch}$), Right phase equalized output 325 is provided to a right phase channel detector circuit 334. In some embodiments of the present invention, right phase channel detector circuit 334 is a four state Viterbi algorithm data detector circuit. Right phase channel detector circuit 334 is operable to apply the data detection algorithm to right phase equalized output 325 to yield a right phase detected output 345. Right phase detected output 345 includes both hard decisions and soft data.

Right phase channel detector circuit 334 applies the data detection algorithm guided by edge mean values 367 calculated by an adaptive Viterbi circuit 364. In particular, adaptive Viterbi circuit 364 calculates edge mean values 367 based upon a known data input 303 and an input 335 corresponding to right phase detected output 345. In particular, adaptive Viterbi circuit 364 determines whether a possible error event has occurred. Again, a possible error event is defined as a finite path beginning at the divergence between a known data path and a decision data path and ending at re-convergence of the known data path and the decision data path.

Where a possible error event is not identified by adaptive Viterbi circuit 364, edge mean values 367 are not updated. Alternatively, where a possible error event is identified by adaptive Viterbi circuit 364, a delta K value is calculated for the possible event. The delta K value is calculated in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\}.$$

The term $y_{k+i}$ is input 335 corresponding to the k+i state transition.

Adaptive Viterbi circuit 364 compares the calculated delta K value with the same threshold value used by adaptive Viterbi circuit 364. Where the delta K value is greater than the threshold value, edge mean values 367 are not updated. In contrast, where the delta K value is equal to or smaller than the threshold value, adaptive Viterbi circuit 364 calculates updated edge mean values 367. Updated edge mean values 367 are calculated in accordance with the following equations:

edge mean$_{k+i}^{known\ data\ path\ branch}$=edge mean$_{k+i}^{known\ data\ path\ branch}$+μ($y_{k+i}$−edge mean$_{k+i}^{known\ data\ path\ branch}$), edge mean$_{k+i}^{decision\ data\ path\ branch}$=edge mean$_{k+i}^{decision\ data\ path\ branch}$−μ($y_{k+i}$−edge mean$_{k+i}^{decision\ data\ path\ branch}$), Each of left phase detected output 341, center phase detected output 343 and right phase detected output 345 are provided to a decision combination selector circuit 350. Decision combination selector circuit 350 selects one of left phase detected output 341, center phase detected output 343 or right phase detected output 345 that exhibits the highest quality as indicated by the soft data. The selected one of left phase detected output 341, center phase detected output 343 or right phase detected output 345 is provided as decision output 352. As such, decision output 352 includes both the hard decisions and the soft data corresponding to the selected one of left phase detected output 341, center phase detected output 343 or right phase detected output 345.

Figure 4:
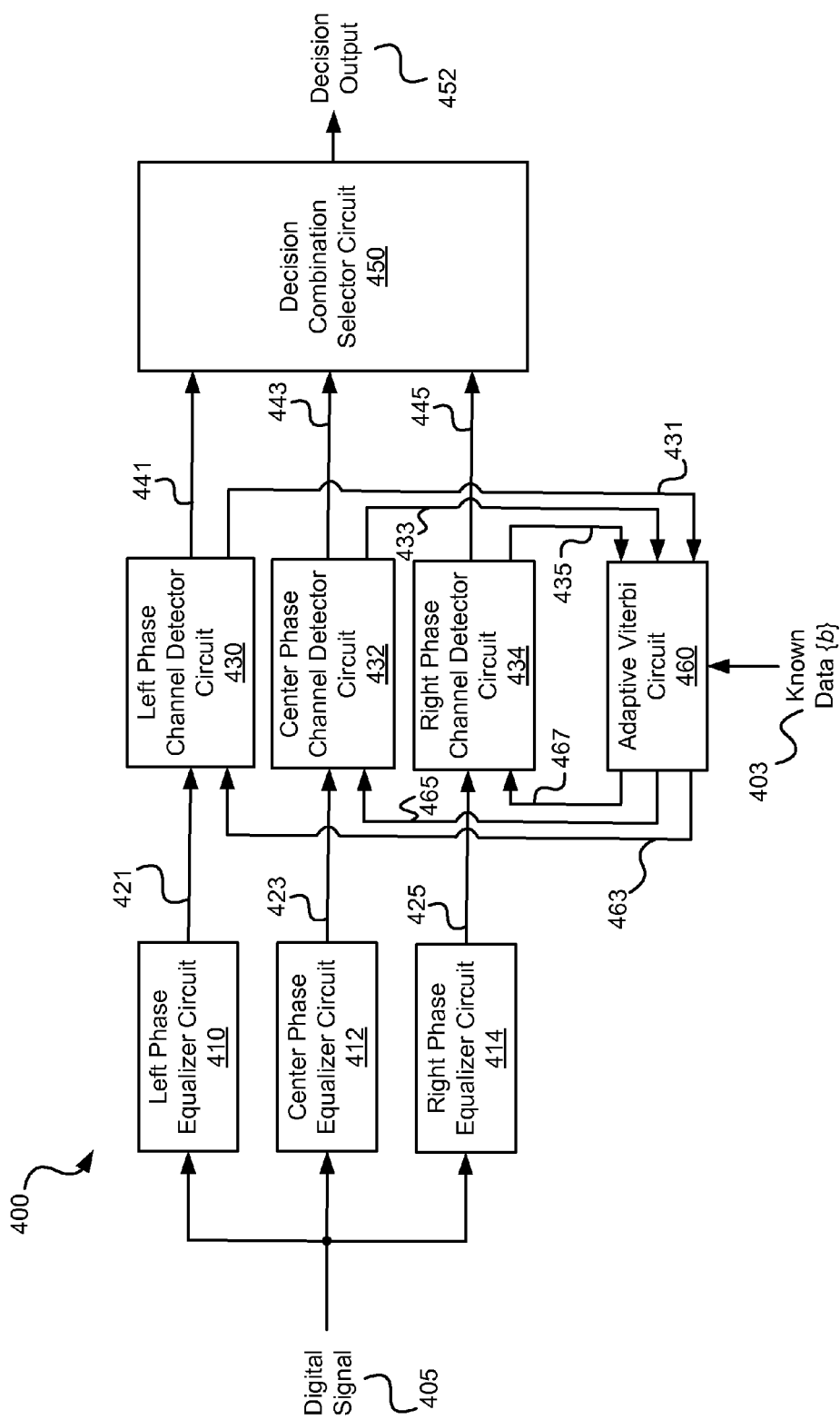
FIG. 4 depicts yet another implementation of a state detector based equalization circuit including a serial adaptive Viterbi circuit in accordance with some embodiments of the present invention.

Turning to FIG. 4, a state detector based equalization circuit 400 including a serial adaptive Viterbi circuit 460 is shown in accordance with some embodiments of the present invention. State detector based equalization circuit 400 may be used in place of state detector based equalization circuit 120. Where state detector based equalization circuit 400 is used in place of state detector based equalization circuit 120, digital samples 115 are provided as a digital signal 405 and a decision output 452 is provided as equalized output 125.

State detector based equalization circuit 400 includes a left phase equalizer circuit 410 that is operable to equalize digital signal 405 adjusted for a left phase to yield a left phase equalized output 421. Left phase equalizer circuit 410 may be implemented as a digital finite impulse response filter circuit. Digital signal 405 adjusted for the left phase is done by interpolating digital signal 405 to correspond to a sampling clock operating at the current sampling phase less an offset (i.e., current sampling phase −Δ phase). In some embodiments of the present invention, the value of Δ phase is programmable, while in other embodiments the value of Δ phase is fixed. In addition, state detector based equalization circuit 400 includes a center phase equalizer circuit 412 that is operable to equalize digital signal 405 to yield a center phase equalized output 423. Center phase equalizer circuit 412 may be implemented as a digital finite impulse response filter circuit. Yet further, state detector based equalization circuit 400 includes a right phase equalizer circuit 414 that is operable to equalize digital signal 405 adjusted for a right phase to yield a right phase equalized output 425. Right phase equalizer circuit 414 may be implemented as a digital finite impulse response filter circuit. Digital signal 405 adjusted for the right phase is done by interpolating digital signal 405 to correspond to a sampling clock operating at the current sampling phase plus an offset (i.e., current sampling phase $+\Delta$ phase). Again, in some embodiments of the present invention, the value of $\Delta$ phase is programmable, while in other embodiments the value of $\Delta$ phase is fixed. Using a left phase, center phase and right phase equalizer circuits allows for an extended range of phase adjustment by timing recovery loop circuit 190.

Left phase equalized output 421 is provided to a left phase channel detector circuit 430. In some embodiments of the present invention, left phase channel detector circuit 430 is a four state Viterbi algorithm data detector circuit. Left phase channel detector circuit 430 is operable to apply a data detection algorithm to left phase equalized output 421 to yield a left phase detected output 441. Left phase detected output 441 includes both hard decisions and soft data. Left phase channel detector circuit 430 applies the data detection algorithm guided by edge mean values 463 calculated by an adaptive Viterbi circuit 460. In particular, adaptive Viterbi circuit 460 calculates edge mean values 463 based upon a known data input 403 and an input 431 corresponding to left phase detected output 441.

Center phase equalized output 423 is provided to a center phase channel detector circuit 432. In some embodiments of the present invention, center phase channel detector circuit 432 is a four state Viterbi algorithm data detector circuit. Center phase channel detector circuit 432 is operable to apply the data detection algorithm to center phase equalized output 423 to yield a center phase detected output 443. Center phase detected output 443 includes both hard decisions and soft data. Center phase channel detector circuit 432 applies the data detection algorithm guided by edge mean values 465 also calculated by adaptive Viterbi circuit 460.

Right phase equalized output 425 is provided to a right phase channel detector circuit 434. In some embodiments of the present invention, right phase channel detector circuit 434 is a four state Viterbi algorithm data detector circuit. Right phase channel detector circuit 434 is operable to apply the data detection algorithm to right phase equalized output 425 to yield a right phase detected output 445. Right phase detected output 445 includes both hard decisions and soft data. Right phase channel detector circuit 434 applies the data detection algorithm guided by edge mean values 467 also calculated by adaptive Viterbi circuit 460.

Adaptive Viterbi circuit 460 serially calculates edge mean values 463, edge mean values 465 and edge mean values 467. In particular, adaptive Viterbi circuit 460 first calculates edge mean values 463 based upon input 431 and known data 403. Next, adaptive Viterbi circuit 460 calculates edge mean values 465 based upon input 433 and known data 403. Finally, adaptive Viterbi circuit 460 calculates edge mean values 467 based upon input 435 and known data 403. This process of cycling through the updating of edge mean values 463, edge mean values 465 and edge mean values 467 is repeatedly performed.

In performing its calculation, adaptive Viterbi circuit 460 determines whether a possible error event has occurred. A possible error event is defined as a finite path beginning at the divergence between a known data path and a decision data path and ending at re-convergence of the known data path and the decision data path. Turning to FIG. 6, trellis diagram 600 is depicted that shows an example of such a possible error event. In particular, the decision data path (i.e., the output from left phase channel detector circuit 430, the output from center phase channel detector circuit 432, or the output from right phase channel detector circuit 434 depending upon which of edge mean values 463, edge mean values 465 and edge mean values 467 are being updated) transitions to state 615 and the known data path (i.e., an output from a channel detector circuit where known data 403 is provided as an input) transitions to state 612. This divergence of the known data path and the decision data path continue until each path re-converges at state 633. Based upon the disclosure provided herein, one of ordinary skill in the art will recognize a variety of possible error events that may occur in relation to one or more embodiments of the present invention. The identification of a possible error event is done by an adaptive Viterbi circuit.

Where a possible error event is not identified by adaptive Viterbi circuit 460, the currently processing edge mean values (i.e., one of edge mean values 463, edge mean values 465 or edge mean values 467) are not updated. Alternatively, where a possible error event is identified by adaptive Viterbi circuit 460, a delta K value is calculated for the possible event. The delta K value is calculated in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\},$$

where L is the length of the possible error event. Thus, using the example of FIG. 6, L is equal to three (3) corresponding to the number of transitions between state 609 and state 633 less one (1). The term edge mean$_{k+i}^{known\ data\ path\ branch}$ is the expected output along the known data path at time or index k+i. Thus, using the example of FIG. 6, edge mean$_{k+0}^{known\ data\ path\ branch}$ is the expected output along the known data for a transition between state 609 and state 612, edge mean$_{k+1}^{known\ data\ path\ branch}$ is the expected output along the known data for a transition between state 612 and state 618, edge mean$_{k+2}^{known\ data\ path\ branch}$ is the expected output along the known data for a transition between state 618 and state 627, and edge mean$_{k+3}^{known\ data\ path\ branch}$ is the expected output along the known data for a transition between state 627 and state 633. The term edge mean$_{k+i}^{decision\ data\ path\ branch}$ is the expected output along the Viterbi decision path at time or index k+i. Thus, using the example of FIG. 6, edge mean$_{k+0}^{decision\ data\ path\ branch}$ is the expected output along the Viterbi decision path for a transition between state 609 and state 615, edge mean$_{k+1}^{decision\ data\ path\ branch}$ is the expected output along the Viterbi decision path for a transition between state 615 and state 621, edge mean$_{k+2}^{decision\ data\ path\ branch}$ is the expected output along the Viterbi decision path for a transition between state 621 and state 624, and edge mean$_{k+3}^{decision\ data\ path\ branch}$ is the expected output along the Viterbi decision path for a transition between state 624 and state 633. The term $y_{k+i}$ is the input corresponding to the edge mean value being calculated (i.e., input 431 where edge mean values 463 are being updated, input 433 where edge mean values 465 are being updated, or input 435 where edge mean values 467 are being updated) corresponding to the k+i state transition.

Adaptive Viterbi circuit 460 compares the calculated delta K value with a threshold value. This threshold value may be either fixed or programmable depending upon the particular implementation. Where the delta K value is greater than the threshold value, edge mean values 463 are not updated. In contrast, where the delta K value is equal to or smaller than the threshold value, adaptive Viterbi circuit 460 calculates updated edge mean values (i.e., one of edge mean values 463, edge mean values 465 and edge mean values 467). The updated edge mean values are calculated in accordance with the following equations:

$$\text{edge mean}_{k+i}^{known\ data\ path\ branch} = \text{edge mean}_{k+i}^{known\ data\ path\ branch} + \mu(y_{k+i} - \text{edge mean}_{k+i}^{known\ data\ path\ branch}),$$

$$\text{edge mean}_{k+i}^{decision\ data\ path\ branch} = \text{edge mean}_{k+i}^{decision\ data\ path\ branch} - \mu(y_{k+i} - \text{edge mean}_{k+i}^{decision\ data\ path\ branch}),$$

and where $\mu$ is a gain factor. In various embodiments of the present invention $\mu$ is programmable, while in other embodiments $\mu$ is fixed.

Each of left phase detected output 441, center phase detected output 443 and right phase detected output 445 are provided to a decision combination selector circuit 450. Decision combination selector circuit 450 selects one of left phase detected output 441, center phase detected output 443 or right phase detected output 445 that exhibits the highest quality as indicated by the soft data. The selected one of left phase detected output 441, center phase detected output 443 or right phase detected output 445 is provided as decision output 452. As such, decision output 452 includes both the hard decisions and the soft data corresponding to the selected one of left phase detected output 441, center phase detected output 443 or right phase detected output 445.

Figure 5:
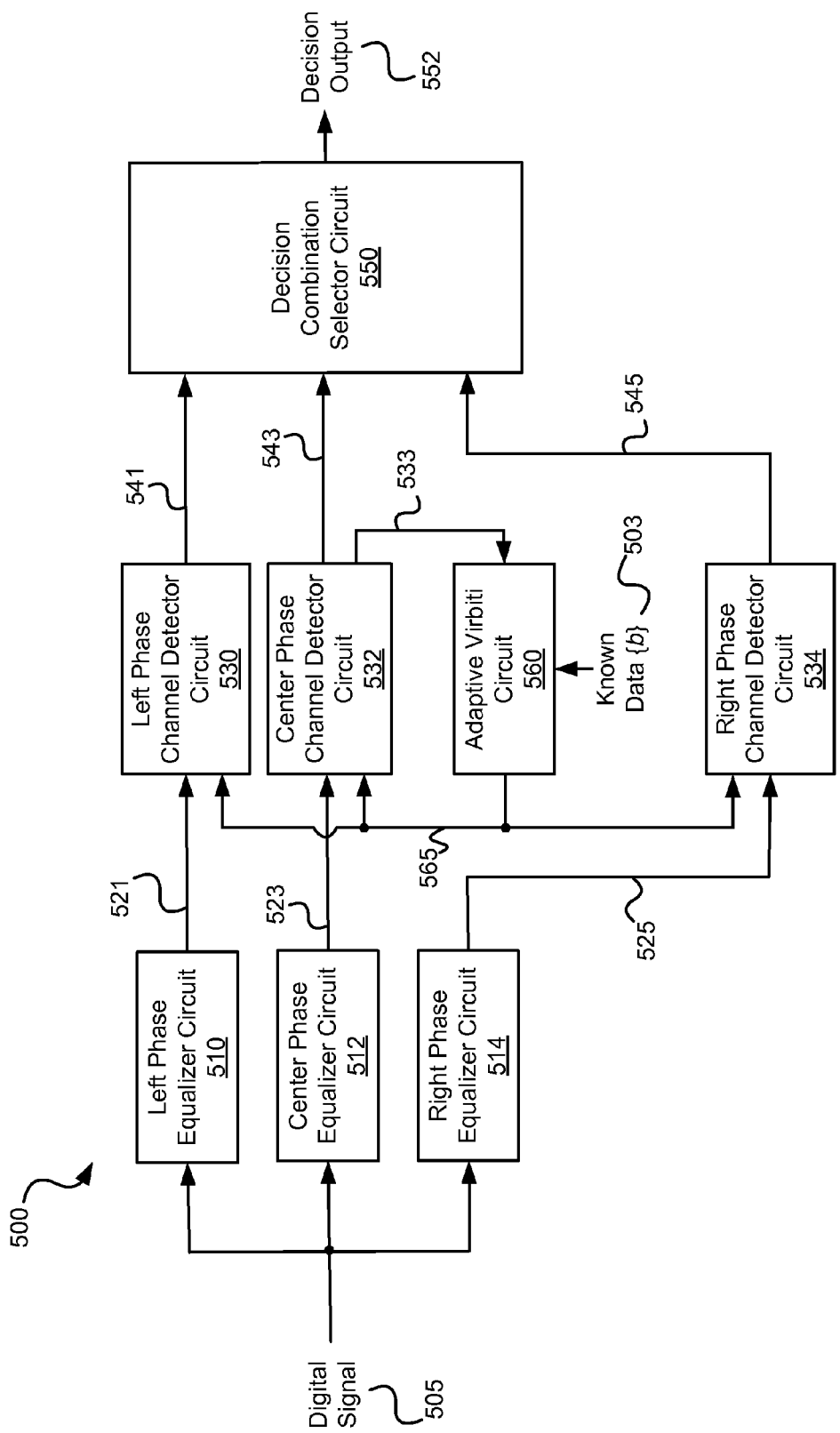
FIG. 5 shows yet another implementation of a state detector based equalization circuit including a single adaptive Viterbi circuit in accordance with some embodiments of the present invention.

Turning to FIG. 5, a state detector based equalization circuit 500 including a single adaptive Viterbi circuit 560 is shown in accordance with some embodiments of the present invention. State detector based equalization circuit 500 may be used in place of state detector based equalization circuit 120. Where state detector based equalization circuit 500 is used in place of state detector based equalization circuit 120, digital samples 115 are provided as a digital signal 505 and a decision output 552 is provided as equalized output 125.

State detector based equalization circuit 500 includes a left phase equalizer circuit 510 that is operable to equalize digital signal 505 adjusted for a left phase to yield a left phase equalized output 521. Left phase equalizer circuit 510 may be implemented as a digital finite impulse response filter circuit. Digital signal 505 adjusted for the left phase is done by interpolating digital signal 505 to correspond to a sampling clock operating at the current sampling phase less an offset (i.e., current sampling phase −Δ phase). In some embodiments of the present invention, the value of Δ phase is programmable, while in other embodiments the value of Δ phase is fixed. In addition, state detector based equalization circuit 500 includes a center phase equalizer circuit 512 that is operable to equalize digital signal 505 to yield a center phase equalized output 523. Center phase equalizer circuit 512 may be implemented as a digital finite impulse response filter circuit. Yet further, state detector based equalization circuit 500 includes a right phase equalizer circuit 514 that is operable to equalize digital signal 505 adjusted for a right phase to yield a right phase equalized output 525. Right phase equalizer circuit 514 may be implemented as a digital finite impulse response filter circuit. Digital signal 505 adjusted for the right phase is done by interpolating digital signal 505 to correspond to a sampling clock operating at the current sampling phase plus an offset (i.e., current sampling phase +Δ phase). Again, in some embodiments of the present invention, the value of Δ phase is programmable, while in other embodiments the value of Δ phase is fixed. Using a left phase, center phase and right phase equalizer circuits allows for an extended range of phase adjustment by timing recovery loop circuit 190.

Center phase equalized output 523 is provided to a center phase channel detector circuit 532. In some embodiments of the present invention, center phase channel detector circuit 532 is a four state Viterbi algorithm data detector circuit. Center phase channel detector circuit 532 is operable to apply the data detection algorithm to center phase equalized output 523 to yield a center phase detected output 543. Center phase detected output 543 includes both hard decisions and soft data. Center phase channel detector circuit 532 applies the data detection algorithm guided by edge mean values 565 calculated by adaptive Viterbi circuit 560.

Adaptive Viterbi circuit 560 determines whether a possible error event has occurred. A possible error event is defined as a finite path beginning at the divergence between a known data path and a decision data path and ending at re-convergence of the known data path and the decision data path. Turning to FIG. 6, a trellis diagram 600 is depicted that shows an example of such a possible error event. In particular, the decision data path (i.e., the output from center phase channel detector circuit 532) transitions to state 615 and the known data path (i.e., an output from a channel detector circuit where known data 503 is provided as an input) transitions to state 612. This divergence of the known data path and the decision data path continue until each path re-converges at state 633. Based upon the disclosure provided herein, one of ordinary skill in the art will recognize a variety of possible error events that may occur in relation to one or more embodiments of the present invention. The identification of a possible error event is done by an adaptive Viterbi circuit.

Where a possible error event is not identified by adaptive Viterbi circuit 560, edge mean values 563 are not updated. Alternatively, where a possible error event is identified by adaptive Viterbi circuit 560, a delta K value is calculated for the possible event. The delta K value is calculated in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\},$$

where L is the length of the possible error event. Thus, using the example of FIG. 6, L is equal to three (3) corresponding to the number of transitions between state 609 and state 633 less one (1). The term edge mean$_{k+i}^{known\ data\ path\ branch}$ is the expected output along the known data path at time or index k+i. Thus, using the example of FIG. 6, edge mean$_{k+0}^{known\ data\ path\ branch}$ is the expected output along the known data for a transition between state 609 and state 612, edge mean$_{k+1}^{known\ data\ path\ branch}$ is the expected output along the known data for a transition between state 612 and state 618, edge mean$_{k+2}^{known\ data\ path\ branch}$ is the expected output along the known data for a transition between state 618 and state 627, and edge mean$_{k+3}^{known\ data\ path\ branch}$ is the expected output along the known data for a transition between state 627 and state 633. The term edge mean$_{k+i}^{decision\ data\ path\ branch}$ is the expected output along the Viterbi decision path at time or index k+i. Thus, using the example of FIG. 6, edge mean$_{k+0}^{decision\ data\ path\ branch}$ is the expected output along the Viterbi decision path for a transition between state 609 and state 615, edge mean$_{k+1}^{decision\ data\ path\ branch}$ is the expected output along the Viterbi decision path for a transition between state 615 and state 621, edge mean$_{k+2}^{decision\ data\ path\ branch}$ is the expected output along the Viterbi decision path for a transition between state 621 and state 624, and edge mean$_{k+3}^{decision\ data\ path\ branch}$ is the expected output along the Viterbi decision path for a transition between state 624 and state 633. The term $y_{k+i}$ is the input corresponding to the edge mean value being calculated (i.e., input 431 where edge mean values 463 are being updated, input 433 where edge mean values 465 are being updated, or input 435 where edge mean values 467 are being updated) corresponding to the k+i state transition.

Adaptive Viterbi circuit 560 compares the calculated delta K value with a threshold value. This threshold value may be either fixed or programmable depending upon the particular implementation. Where the delta K value is not greater than the threshold value, edge mean values 563 are not updated. In contrast, where the delta K value is equal to or greater than the threshold value, adaptive Viterbi circuit 560 calculates updated edge mean values 563. Updated edge mean values 563 are calculated in accordance with the following equations:

$$\text{edge mean}_{k+i}^{known\ data\ path\ branch} = \text{edge mean}_{k+i}^{known\ data\ path\ branch} + \mu(y_{k+i} - \text{edge mean}_{k+i}^{known\ data\ path\ branch}),$$

$$\text{edge mean}_{k+i}^{decision\ data\ path\ branch} = \text{edge mean}_{k+i}^{decision\ data\ path\ branch} - \mu(y_{k+i} - \text{edge mean}_{k+i}^{decision\ data\ path\ branch}),$$

and where μ is a gain factor. In various embodiments of the present invention μ is programmable, while in other embodiments μ is fixed.

Left phase equalized output 521 is provided to a left phase channel detector circuit 530. In some embodiments of the present invention, left phase channel detector circuit 530 is a four state Viterbi algorithm data detector circuit. Left phase channel detector circuit 530 is operable to apply a data detection algorithm to left phase equalized output 521 to yield a left phase detected output 541. Left phase detected output 541 includes both hard decisions and soft data. Left phase channel detector circuit 530 applies the data detection algorithm guided by edge mean values 563 calculated by adaptive Viterbi circuit 560. Right phase equalized output 525 is provided to a right phase channel detector circuit 534. In some embodiments of the present invention, right phase channel detector circuit 534 is a four state Viterbi algorithm data detector circuit. Right phase channel detector circuit 534 is operable to apply the data detection algorithm to right phase equalized output 525 to yield a right phase detected output 545. Right phase detected output 545 includes both hard decisions and soft data. Right phase channel detector circuit 534 applies the data detection algorithm guided by edge mean values 565 calculated by adaptive Viterbi circuit 560.

Each of left phase detected output 541, center phase detected output 543 and right phase detected output 545 are provided to a decision combination selector circuit 550. Decision combination selector circuit 550 selects one of left phase detected output 541, center phase detected output 543 or right phase detected output 545 that exhibits the highest quality as indicated by the soft data. The selected one of left phase detected output 541, center phase detected output 543 or right phase detected output 545 is provided as decision output 552. As such, decision output 552 includes both the hard decisions and the soft data corresponding to the selected one of left phase detected output 541, center phase detected output 543 or right phase detected output 545.

Figure 7:
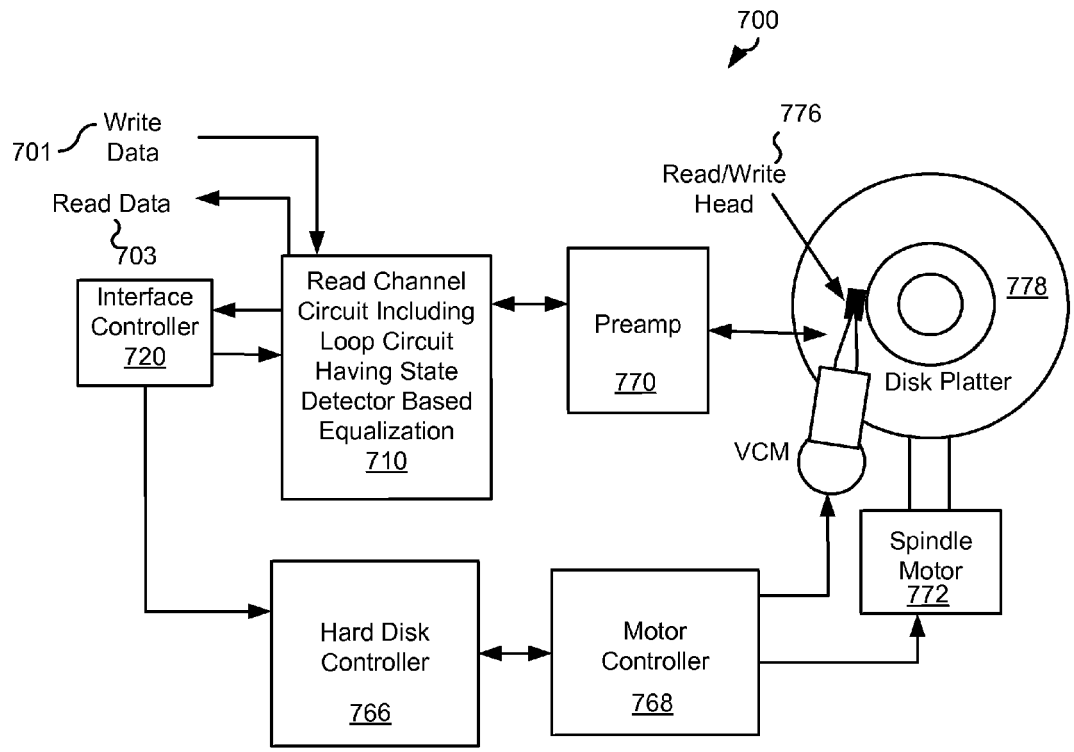
FIG. 7 shows a storage system including a read channel circuit having a timing recovery loop circuit relying on a state detector based equalization circuit in accordance with various embodiments of the present invention.

Turning to FIG. 7, a storage system 700 including a read channel circuit 710 having a timing recovery loop circuit relying on a state detector based equalization circuit in accordance with various embodiments of the present invention. Storage system 700 may be, for example, a hard disk drive. Storage system 700 also includes a preamplifier 770, an interface controller 720, a hard disk controller 766, a motor controller 768, a spindle motor 772, a disk platter 778, and a read/write head 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with either a longitudinal or a perpendicular recording scheme.

In a typical read operation, read/write head assembly 776 is accurately positioned by motor controller 768 over a desired data track on disk platter 778. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 776 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel circuit 710 via preamplifier 770. Preamplifier 770 is operable to amplify the minute analog signals accessed from disk platter 778. In turn, read channel circuit 710 decodes and digitizes the received analog signal to recreate the information originally written to disk platter 778. This data is provided as read data 703 to a receiving circuit. A write operation is substantially the opposite of the preceding read operation with write data 701 being provided to read channel circuit 710. This data is then encoded and written to disk platter 778.

As part of processing the received information, read channel circuit 710 utilizes a loop circuit including state detector based equalization to update a sample clock used by an analog to digital converter circuit. The loop circuit may be implemented similar to that discussed above in relation to FIG. 1. The state detector based equalization may be implemented similar to one of the circuits discussed above in relation to FIG. 2-5. The process of sample clock adjustment may be done similar to that discussed above in relation to FIG. 9 below.

It should be noted that storage system 700 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 700, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 710 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 700 may be modified to include solid state memory that is used to store data in addition to the storage offered by disk platter 778. This solid state memory may be used in parallel to disk platter 778 to provide additional storage. In such a case, the solid state memory receives and provides information directly to read channel circuit 710. Alternatively, the solid state memory may be used as a cache where it offers faster access time than that offered by disk platter 778. In such a case, the solid state memory may be disposed between interface controller 720 and read channel circuit 710 where it operates as a pass through to disk platter 778 when requested data is not available in the solid state memory or when the solid state memory does not have sufficient storage to hold a newly written data set. Based upon the disclosure provided herein, one of ordinary skill in the art will recognize a variety of storage systems including both disk platter 778 and a solid state memory.

Figure 8:
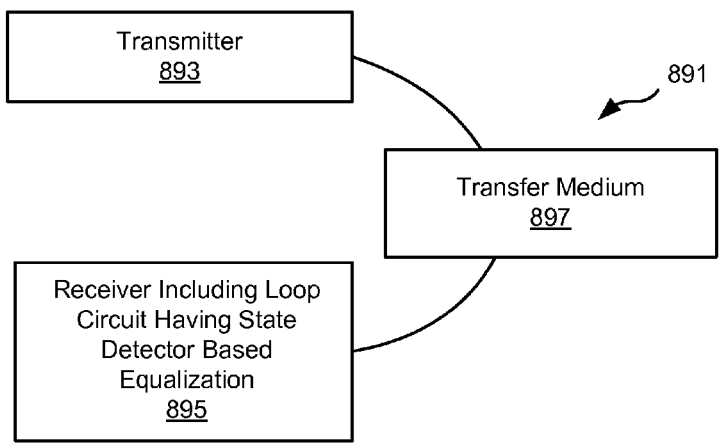
FIG. 8 depicts a data transmission system including a receiver having a timing recovery loop circuit relying on a state detector based equalization circuit in accordance with one or more embodiments of the present invention.

Turning to FIG. 8, a data transmission system 891 including a receiver 895 having a timing recovery loop circuit relying on a state detector based equalization circuit in accordance with various embodiments of the present invention. Data transmission system 891 includes a transmitter 893 that is operable to transmit encoded information via a transfer medium 897 as is known in the art. The encoded data is received from transfer medium 897 by a receiver 895. Receiver 895 processes the received input to yield the originally transmitted data.

As part of processing the received information, receiver 895 utilizes a loop circuit including state detector based equalization to update a sample clock used by an analog to digital converter circuit. The loop circuit may be implemented similar to that discussed above in relation to FIG. 1. The state detector based equalization may be implemented similar to one of the circuits discussed above in relation to FIG. 2-5. The process of sample clock adjustment may be done similar to that discussed above in relation to FIG. 9 below.

Figure 9:
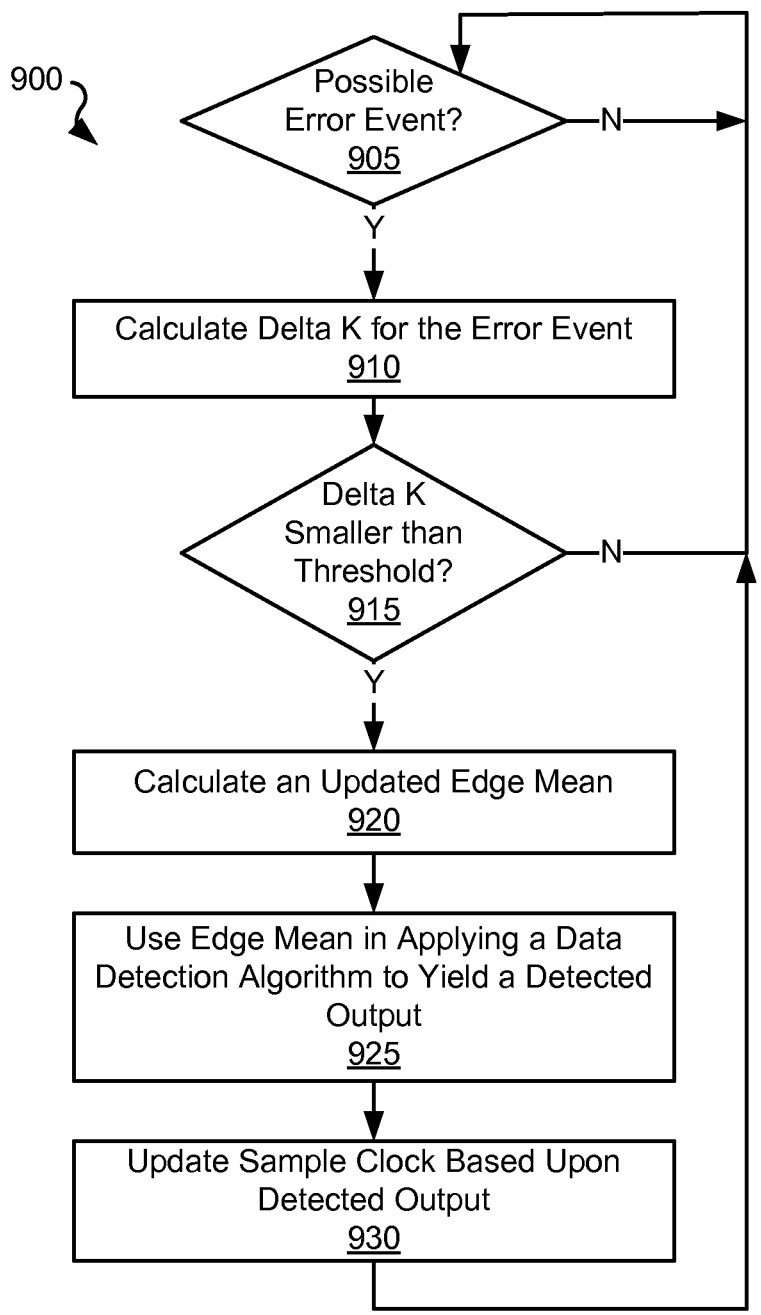
FIG. 9 is a flow diagram showing a method for timing loop feedback in accordance with various embodiments of the present invention.

Turning to FIG. 9, a flow diagram 900 shows a method for timing loop feedback in accordance with various embodiments of the present invention. Following flow diagram 900, it is determined whether a possible error event occurred (block 905). A possible error event is defined as a finite path beginning at the divergence between a known data path and a decision data path and ending at re-convergence of the known data path and the decision data path. FIG. 6 shows one example of a possible error event where the decision data path (shown as a dashed line) diverges at state 609 from the known data path (shown as a solid line). In particular, the decision data path transitions to state 615 and the known data path transitions to state 612. This divergence of the known data path and the decision data path continue until each path re-converges at state 633. Based upon the disclosure provided herein, one of ordinary skill in the art will recognize a variety of possible error events that may occur in relation to one or more embodiments of the present invention. The identification of a possible error event is done by an adaptive Viterbi circuit.

Where a possible error event is identified (block 905), a delta K value is calculated for the event (block 910). The delta K value is calculated in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\},$$

where L is the length of the possible error event. Thus, using the example of FIG. 6, L is equal to three (3) corresponding to the number of transitions between state 609 and state 633 less one (1). The term edge mean$_{k+i}^{known\ data\ path\ branch}$ is the expected output along the known data path at time or index k+i. Thus, using the example of FIG. 6, edge mean$_{k+0}^{known\ data\ path\ branch}$ is the expected output along the known data for a transition between state 609 and state 612, edge mean$_{k+1}^{known\ data\ path\ branch}$ is the expected output along the known data for a transition between state 612 and state 618, edge mean$_{k+2}^{known\ data\ path\ branch}$ is the expected output along the known data for a transition between state 618 and state 627, and edge mean$_{k+3}^{known\ data\ path\ branch}$ is the expected output along the known data for a transition between state 627 and state 633. The term edge mean$_{k+i}^{decision\ data\ path\ branch}$ is the expected output along the Viterbi decision path at time or index k+i. Thus, using the example of FIG. 6, edge mean$_{k+0}^{decision\ data\ path\ branch}$ is the expected output along the Viterbi decision path for a transition between state 609 and state 615, edge mean$_{k+1}^{decision\ data\ path\ branch}$ is the expected output along the Viterbi decision path for a transition between state 615 and state 621, edge mean$_{k+2}^{decision\ data\ path\ branch}$ is the expected output along the Viterbi decision path for a transition between state 621 and state 624, and edge mean$_{k+3}^{decision\ data\ path\ branch}$ is the expected output along the Viterbi decision path for a transition between state 624 and state 633. The term $y_{k+i}$ is the input corresponding to the edge mean value being calculated (i.e., input 431 where edge mean values 463 are being updated, input 433 where edge mean values 465 are being updated, or input 435 where edge mean values 467 are being updated) corresponding to the k+i state transition.

The delta K value is compared with a threshold value (block 915). This threshold value may be either fixed or programmable depending upon the particular implementation. Where the delta K value is smaller than the threshold (block 915), updated edge mean values are calculated (block 920). The updated edge mean values are calculated in accordance with the following equations:

edge mean$_{k+i}^{known\ data\ path\ branch}$=edge mean$_{k+i}^{known\ data\ path\ branch}$+μ($y_{k+i}$−edge mean$_{k+i}^{known\ data\ path\ branch}$), edge mean$_{k+i}^{decision\ data\ path\ branch}$=edge mean$_{k+i}^{decision\ data\ path\ branch}$−μ($y_{k+i}$−edge mean$_{k+i}^{decision\ data\ path\ branch}$), and where μ is a gain factor.

These updated edge mean values are provided to a data detector circuit where they are used to modify a detected output. This detected output is then used to calculate and error value (i.e., a difference from the actual detected output and an ideal output) and the error value is used to update a sample clock used to control a sample phase and/or frequency of an analog to digital converter circuit from which the term $y_{k+i}$ is derived (block 930).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a loop feedback circuit including:
        an equalization circuit operable to equalize a data input to yield a equalizer output, wherein the equalization circuit includes:
            a first phase equalizer circuit operable to equalize the data input to yield a first phase equalized output, wherein the first phase equalized output is offset from a defined phase by a first phase offset;
            a second phase equalizer circuit operable to equalize the data input to yield a second phase equalized output, wherein the second phase equalized output is offset from the defined phase by a second phase offset; and
            a selection circuit operable to select between at least one of a first output derived from the first phase equalized output or a second output derived from the second phase equalized output to be provided as the equalizer output; and
        a data detector circuit operable to apply a data detection algorithm to the equalizer output to yield a detected output.

2. The data processing system of claim 1, wherein the data processing system further comprises:
    an analog to digital converter circuit operable to convert an analog input into a series of digital samples provided as the data input synchronized by a sampling clock; and
    wherein the loop feedback circuit further comprises:
        a sample clock adjustment circuit operable to update the sampling clock based upon a combination of the equalizer output and the detected output.

3. The data processing system of claim 2, wherein the data processing system further comprises:
    a backend processing circuit operable to recover an original data set using the data input.

4. The data processing system of claim 3, wherein the data detector circuit is a first data detector circuit, the detected output is a first detected output, and the data detection algorithm is a first data detection algorithm, and wherein the backend processing circuit comprises:
    a digital finite impulse response circuit operable to equalize the data input to yield a detector input;
    a second data detector circuit operable to apply a second data detection algorithm to the detector input to yield a second detected output; and
    a data decoder circuit operable to apply a data decode algorithm to a decoder input to yield a decoded output, wherein the decoder input is derived from the second detected output.

5. The data processing system of claim 1, wherein the data detection algorithm is a first data detection algorithm, wherein the defined phase offset is zero, wherein the first phase offset is a left phase offset, wherein the second phase offset is a right phase offset, and wherein the equalization circuit comprises:
    a center phase equalizer circuit operable to equalize the data input to yield a center phase equalized output;
    a left phase channel detector circuit operable to apply a second data detection algorithm to the first phase equalized output to yield a left phase detected output, wherein the left phase detected output is the first output derived from the first phase equalized output;
    a center phase channel detector circuit operable to apply the second data detection algorithm to the center phase equalized output to yield a center phase detected output, wherein the center phase detected output is the second output derived from the second phase equalized output;
    a right phase channel detector circuit operable to apply the second data detection algorithm to the second phase equalized output to yield a right phase detected output; and
    wherein the selection circuit operable to provide one of the left phase detected output, the center phase detected output, or the right phase detected output as the equalizer output.

6. The data processing system of claim 5, wherein the first detection algorithm includes more states than the second detection algorithm.

7. The data processing system of claim 6, wherein the first detection algorithm is a sixteen state data detection algorithm, and the second detection algorithm is a four state data detection algorithm.

8. The data processing system of claim 5, wherein the equalization circuit further comprises:
    an adaptive Viterbi circuit operable to update edge mean values based at least in part on the center phase detected output and a known input, wherein application of the second data detection algorithm by the center phase channel detector circuit is controlled at least in part by the edge mean values.

9. The data processing systems of claim 8, wherein the edge mean values are only updated when a possible error event is detected, wherein the possible error event is defined as a path beginning at the divergence between a known data path and a decision data path and ending at re-convergence of the known data path and the decision data path.

10. The data processing system of claim 8, wherein updating the edge mean values includes calculating a delta K value in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\},$$

wherein L is the length of the possible error event,
wherein edge mean$_{k+i}^{known\ data\ path\ branch}$ is the expected output along the known data path, and wherein edge mean$_{k+i}^{decision\ data\ path\ branch}$ is the expected output along a decision path of the data detector circuit.

11. The data processing system of claim 10, wherein the edge mean values are only updated when a value of delta K is less than a threshold value.

12. The data processing system of claim 8, wherein updating the edge mean values is done in accordance with the following equations:

edge mean$_{k+i}^{known\ data\ path\ branch}$=edge mean$_{k+i}^{known\ data\ path\ branch}$+μ(y$_{k+i}$−edge mean$_{k+i}^{known\ data\ path\ branch}$), edge mean$_{k+i}^{decision\ data\ path\ branch}$=edge mean$_{k+i}^{decision\ data\ path\ branch}$−μ(y$_{k+i}$−edge mean$_{k+i}^{decision\ data\ path\ branch}$), wherein μ is a gain factor, wherein L is the length of the possible error event, wherein edge mean$_{k+i}^{known\ data\ path\ branch}$ is the expected output along the known data path, and wherein edge mean$_{k+i}^{decision\ data\ path\ branch}$ is the expected output along a decision path of the data detector circuit, y$_{k+i}$ is the center phase detected output.

13. The data processing system of claim 1, wherein the data processing system is implemented as an integrated circuit.

14. The data processing system of claim 1, wherein the data processing system is incorporated in a device selected from a group consisting of: a storage device, and a data transmission device.

15. A data processing method, the data processing method comprising:
converting an analog input into a series of digital samples provided as a data input;
equalizing the data input using a left phase equalizer circuit to yield a left phase equalized output, wherein the left phase equalized output is offset from a center phase by a phase offset;
equalizing the data input using a center phase equalizer circuit to yield a center phase equalized output, wherein the center phase equalized output is not offset from the center phase;
applying a second data detection algorithm to the left phase equalized output to yield a left phase detected output;
applying the second data detection algorithm to the center phase equalized output to yield a center phase detected output;
selecting one of the left phase detected output or the center phase detected output as an equalizer output;
applying a first data detection algorithm to the equalizer output to yield a detected output; and
updating a feedback output based upon a combination of the equalizer output and the detected output.

16. The method of claim 15, wherein the first detection algorithm includes more states than the second detection algorithm.

17. The method of claim 15, wherein the method further comprises:
updating edge mean values based at least in part on the center phase detected output and a known input, wherein applying the second data detection algorithm by the center phase channel detector circuit is controlled at least in part by the edge mean values.

18. The method of claim 17, wherein the edge mean values are only updated when a possible error event is detected, wherein the possible error event is defined as a path beginning at the divergence between a known data path and a decision data path and ending at re-convergence of the known data path and the decision data path.

19. The method of claim 17, wherein updating the edge mean values includes calculating a delta K value in accordance with the following equation:

$$\Delta_k = \sum_{i=0}^{L} \left\{ \begin{array}{l} (y_{k+i} - \text{edge mean}_{k+i}^{known\ data\ path\ branch})^2 - \\ (y_{k+i} - \text{edge mean}_{k+i}^{decision\ data\ path\ branch})^2 \end{array} \right\},$$

wherein L is the length of the possible error event,
wherein edge mean$_{k+i}^{known\ data\ path\ branch}$ is the expected output along the known data path, and wherein edge mean$_{k+i}^{decision\ data\ path\ branch}$ is the expected output along a decision path of the data detector circuit.

20. The method of claim 19, wherein the edge mean values are only updated when a value of delta K is less than a threshold value.

21. The method of claim 17, wherein updating the edge mean values is done in accordance with the following equations:

edge mean$_{k+i}^{known\ data\ path\ branch}$=edge mean$_{k+i}^{known\ data\ path\ branch}$+μ(y$_{k+i}$−edge mean$_{k+i}^{known\ data\ path\ branch}$), edge mean$_{k+i}^{decision\ data\ path\ branch}$=edge mean$_{k+i}^{decision\ data\ path\ branch}$−μ(y$_{k+i}$−edge mean$_{k+i}^{decision\ data\ path\ branch}$), wherein μ is a gain factor, wherein L is the length of the possible error event, wherein edge mean$_{k+i}^{known\ data\ path\ branch}$ is the expected output along the known data path, and wherein edge mean$_{k+i}^{decision\ data\ path\ branch}$ is the expected output along a decision path of the data detector circuit, y$_{k+i}$ is the center phase detected output.

22. A storage device, the storage device comprising:
a storage medium;
a head assembly disposed in relation to the storage medium and operable to provide a sensed signal corresponding to a data set on the storage;
a read channel circuit including:
an analog to digital converter circuit operable to sample the analog signal derived from the sensed signal to yield a series of digital samples synchronized by a sampling clock;
a loop feedback circuit including:
a state detector based equalization circuit operable to equalize the digital samples to yield a equalizer output, wherein the state detector based equalization circuit includes:
a first means for equalizing the data input to yield a first phase equalized output, wherein the first phase equalized output is offset from a defined phase by a first phase offset;

a second means for equalizing the data input to yield a second phase equalized output, wherein the second phase equalized output is offset from the defined phase by a second phase offset; and a third means for equalizing the data input to yield a third phase equalized output, wherein the third phase equalized output is offset from the defined phase by a third phase offset.

* * * * *